United States Patent
Cepeda-Rizo et al.

(10) Patent No.: US 7,285,851 B1
(45) Date of Patent: Oct. 23, 2007

(54) LIQUID IMMERSION COOLED MULTICHIP MODULE

(75) Inventors: Juan Cepeda-Rizo, Lakewood, CA (US); Mohsen Esmailpour, Newbury Park, CA (US); Nicholas J. Teneketges, Thousand Oaks, CA (US)

(73) Assignee: Teradyne, Inc., Boston, MA (US)

( * ) Notice: Subject to any disclaimer, the term of this patent is extended or adjusted under 35 U.S.C. 154(b) by 0 days.

(21) Appl. No.: 11/540,391

(22) Filed: Sep. 29, 2006

(51) Int. Cl.
*H01L 23/34* (2006.01)
*G06F 1/20* (2006.01)

(52) U.S. Cl. .................. 257/712; 257/713; 257/714; 257/717; 257/718; 257/E33.075; 257/E23.083; 257/E23.04; 257/E23.095; 257/E23.097; 361/676; 361/677; 361/688; 361/689

(58) Field of Classification Search .............. 257/276, 257/625, 675, 706, 707, 796, 712–722, E33.075, 257/E31.131, E23.051, E23.08, E23.113; 361/676, 677, 687–689, 694–704; 174/9 R, 174/15.1, 16.3, 17 R
See application file for complete search history.

(56) References Cited

U.S. PATENT DOCUMENTS

| | | | |
|---|---|---|---|
| 5,514,906 A * | 5/1996 | Love et al. ............. | 257/712 |
| 5,859,763 A | 1/1999 | Nam et al. | |
| 5,901,040 A * | 5/1999 | Cromwell et al. ........ | 361/704 |
| 6,052,284 A | 4/2000 | Suga et al. | |
| 6,223,815 B1 * | 5/2001 | Shibasaki .............. | 165/185 |
| 6,404,640 B1 | 6/2002 | Ishimine et al. | |
| 6,621,707 B2 | 9/2003 | Ishimine et al. | |
| 6,729,383 B1 * | 5/2004 | Cannell et al. ......... | 165/80.3 |
| 6,882,156 B2 | 4/2005 | Hauptman | |
| 7,133,286 B2 * | 11/2006 | Schmidt et al. ......... | 361/718 |
| 2005/0248921 A1 * | 11/2005 | Schmidt et al. ......... | 361/698 |
| 2006/0002086 A1 | 1/2006 | Teneketges et al. | |

FOREIGN PATENT DOCUMENTS

EP 0453675 * 4/1990

OTHER PUBLICATIONS

A.C.Pfahnl, et al., Heat Sinks Reactively Soldered to ICs, DesignCon East 2004, Apr. 5, 2004, published at http://www.mtfoil.com/technology/tech.html.

* cited by examiner

*Primary Examiner*—Jasmine Clark
(74) *Attorney, Agent, or Firm*—Christopher R. Balzan, Esq.; Balzan Intellectual Property Law, PC

(57) ABSTRACT

In one embodiment, a liquid immersion cooled multichip module is provided which includes a substrate having chips mounted thereon and which is adapted to mount with a printed circuit board. A lid is adapted to secure to the printed circuit board so as to mount with the substrate to form a fluid chamber between the lid and the substrate, and to cause the substrate to mate with the printed circuit board. In one embodiment, a cambered bolster plate is located on a side of the printed circuit board opposite the lid and the lid is fastened to the bolster plate to secure the lid to the printed circuit board. A baffle, which may be removable in some embodiments, is located within the lid and directs coolant flow through the fluid chamber.

20 Claims, 3 Drawing Sheets

LIQUID IMMERSION COOLED MULTICHIP MODULE

BACKGROUND

Automated test equipment or ATE, often plays a critical role in the manufacture of semiconductor devices. The equipment provides semiconductor manufacturers with the ability to functionally test each device at the wafer and packaged-device levels. ATE often includes electronic circuit boards, often called channel cards, with multichip modules or MCMs that provide the electronic circuitry for test channels. The test channels apply signals to and capture signals from one or more devices-under-test or DUTs.

The MCMs have densely packed circuitry that generates significant amounts of head. Conventionally, liquid-cooled cold plates having formed surfaces configured to match the surface topology of each board were adequate. With the tendency to pack more channel circuits into smaller chips on the boards, however, heat dissipation associated with the chips may overwhelm the cooling capacity for conventional cold plates. Moreover, cold plates tend to be heavy, comprising metal containers mounted to the surface of each board.

One possible alternative to the use of cold plates for cooling MCMs is to employ immersion cooling techniques. Coolant may be flowed through the MCM, over the chips and/or heat sink to cool the device.

While immersion cooling techniques can provide more efficient cooling, high performance modern electronic chips in the MCMs, especially those used in automated test equipment, are sometimes sensitive to temperature level and fluctuation. The coolant flowing across the chips changes temperature as it flows and may not flow uniformly, so can sometimes cool unevenly. To improve performance of these chips, a stable temperature level is desired across all the chips in an MCM. Thus, what is needed is an MCM that is capable of providing more stable and uniform cooling of the chips in the MCM.

SUMMARY

In one embodiment, a liquid immersion cooled multichip module is provided which includes a substrate having chips mounted thereon and which is adapted to mount with a printed circuit board. A lid is adapted to secure to the printed circuit board so as to mount with the substrate to form a fluid chamber between the lid and the substrate, and to cause the substrate to mate with the printed circuit board. A bolster plate is located on a side of the printed circuit board opposite the lid and the lid is fastened to the bolster plate to secure the lid to the printed circuit board. A baffle located within the lid is constructed to direct a flow of coolant through the fluid chamber.

In some embodiments, the baffle is constructed to direct a flow of coolant through the lid along a generally U-shaped flow path having an inbound segment leading to a transition segment followed by an outbound segment. The outbound segment supplies coolant fluid over the chips so as to provide a parallel flow over a first set of chips followed by a series flow over a downstream chip. The inbound segment supplies a partial flow of coolant laterally across an adjacent chip of the first set of chips to combine with the parallel flow. A flow separator may be included adjacent to the first set of chips.

In some embodiments the bolster plate is a cambered bolster plate. Some embodiments include an O-ring between the lid and the substrate. The lid may be secured to the cambered bolster plate using a threaded fastener to compress the O-ring between the lid and the substrate to seal the fluid chamber.

In some embodiments, the baffle is a removable baffle within the lid constructed to direct a flow of coolant through the fluid chamber. The lid further comprises a fluid inlet and a fluid outlet, the fluid inlet and fluid outlet being located on a same peripheral edge the lid. In some embodiments, the baffle further includes a ramp down region positioned adjacent the first set of chips.

BRIEF DESCRIPTION OF THE DRAWINGS

The features and advantages of the present invention will be better understood with regard to the following description, appended claims, and accompanying drawings where:

DESCRIPTION

Figure 1:
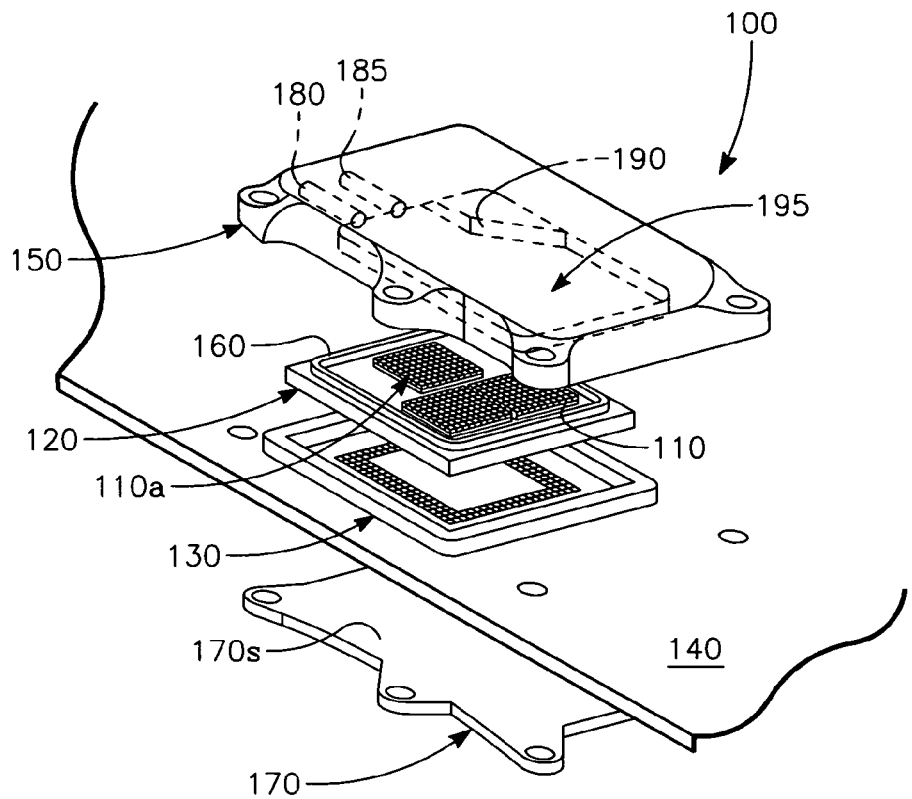
FIG. 1 shows an exploded perspective view of a multichip module.

FIG. 1 shows an exploded perspective view of an MCM 100. The MCM includes chips 110 secured to a substrate 130. The chips 110 may include heat sinks 110a. A connection means, not shown, on the back side of the substrate 120 is mated with a connector 130 on a printed circuit board 140. The connector may be an interposer, or other known connector means, which may contact pads, pins, or the like, on the back side of the substrate 120. A lid 150 is secure to the printed circuit board 140. The lid 150 contacts an O-ring 160 to enclose the chips, and urges the substrate to mount with the connector 130.

A bolster plate 170 is located on the back side of the printed circuit board 140. Fasteners (not shown) such as bolts are used to secure the lid to the printed circuit board.

The lid 150, housing pressurized coolant, must form a liquid tight seal against the substrate 120 without endangering the electronics and the electrical connections in response to the developed hydraulic and clamping forces.

In some embodiments, this is accomplished with an elastomeric O-ring 160 located between the lid 150 and the substrate 120, in combination with the bolster plate 170. The O-ring 160 may be situated in a groove (not shown) in the substrate and/or lid 150 to seal the baffled chamber 195. The bolster plate 170 is a low-profile spring that flattens as the mounting screws (not shown) are torqued to a hard stop. The bolster plate 170 has a built-in cambered (convex) surface 170s that pushes against the backside of the printed circuit board 140 to maintain its flatness. It is designed to counter the combined effect of the developed hydraulic and clamping forces transmitted to the printed circuit board 140.

Helical compression springs in combination with shoulder mounting screws (not depicted here) provide the preset O-ring loading needed to ensure proper compression of the O-ring. A removable Land Grid Array (LGA) connector 130 resides between the substrate 120 and the printed circuit board 140. Planarity of the printed circuit board allows the LGA to achieve proper connection which is achieved by aid of the cambered bolster plate 170.

The coolant fluid inlet and outlet 180 and 185 are located on an edge of the lid 150. The lid 150 contains the baffled chamber 195 within the lid 150. The lid 150, or the baffle 190 itself, may be interchangeable to tailor the coolant fluid flow through the baffled chamber 195 for a particular MCM configuration. The baffle 190 depicted in FIG. 1 is simplified for illustration purposes.

Figure 2:
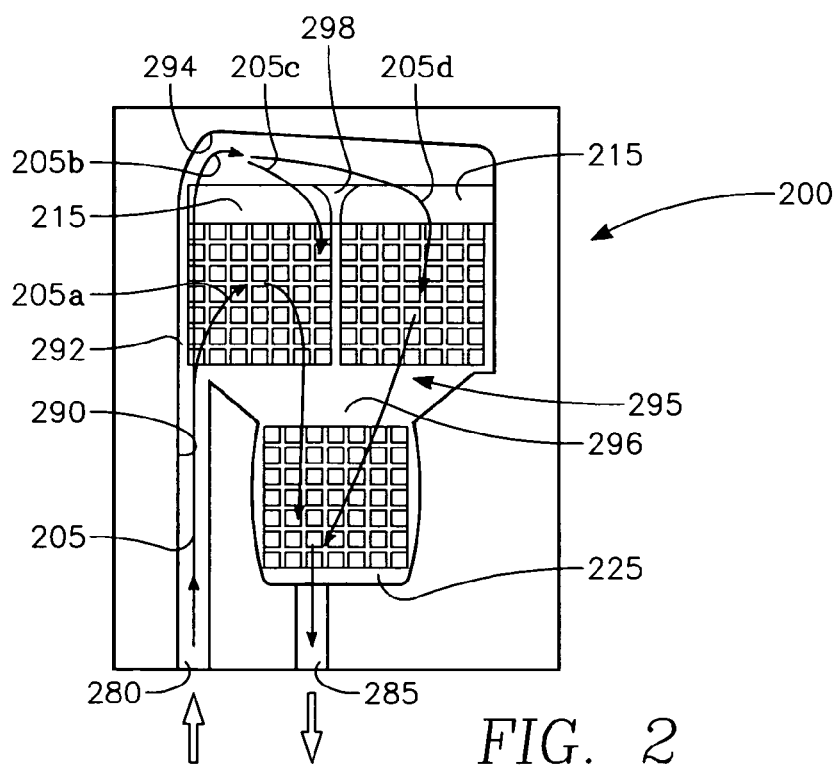
FIG. 2 shows a simplified cut away top view of a multichip module illustrating coolant flow through a baffled chamber.

FIG. 2 shows a simplified cut away top view of an MCM 200 illustrating coolant flow 205 (dashed lines and arrows) through the baffled chamber 295. In this embodiment, a parallel-series flow baffle 290 causes a parallel flow of a portions 205c and 205d of coolant flow 205 over CHIP 2 and CHIP 3, which combine downstream flow over CHIP 1 before exiting the MCM 200. The coolant flow 205 takes a generally U-shape path through the MCM 200 to exit the MCM 200 through the outlet 285 next to the inlet 280.

A portion 205a of the coolant flow 205 in an inbound segment 292 on the inlet side of the generally U-shape path is allowed to flow laterally across CHIP 2, such as by bleeding or porting. The lateral flow portion 205a improves the cooling of CHIP 2, which otherwise would have less coolant flow due to its position inside the curve near the start of a transition portion 294. At the transition portion 294 the main flow path 205b begins flowing back toward the outlet 285. Thus, a portion of the inbound coolant fluid is allowed to bleed laterally across CHIP 2 as it flows inbound, before the main flow path 205b turns to begin its outbound flow across CHIP 2 and CHIP 3 in parallel.

As shown in FIG. 2, a flow separator 298 may be positioned in front of and between CHIP 2 and CHIP 3 to ensure that main flow path 205b is split into sub-portions 205c and 205d, which flow over CHIP 2 and CHIP 3, respectively. This equalizes the coolant fluid flow over CHIP 2 and CHIP 3. A ramp-down region 215 extends in front of CHIP 2 and CHIP 3 and reduces the cross-sectional area of the baffled chamber 295 and directs the coolant 205c and 205d at the heat sink fins. The ramp-down region 215 serves to reduce the pressure drop through the MCM 200 that results from the coolant fluid flowing through the fins. A ramp-up region 225 is located between CHIP 1 and the outlet 285. The ramp-up region 225 provides the coolant fluid to the outlet 285, in line with the inlet 280.

Figure 3:
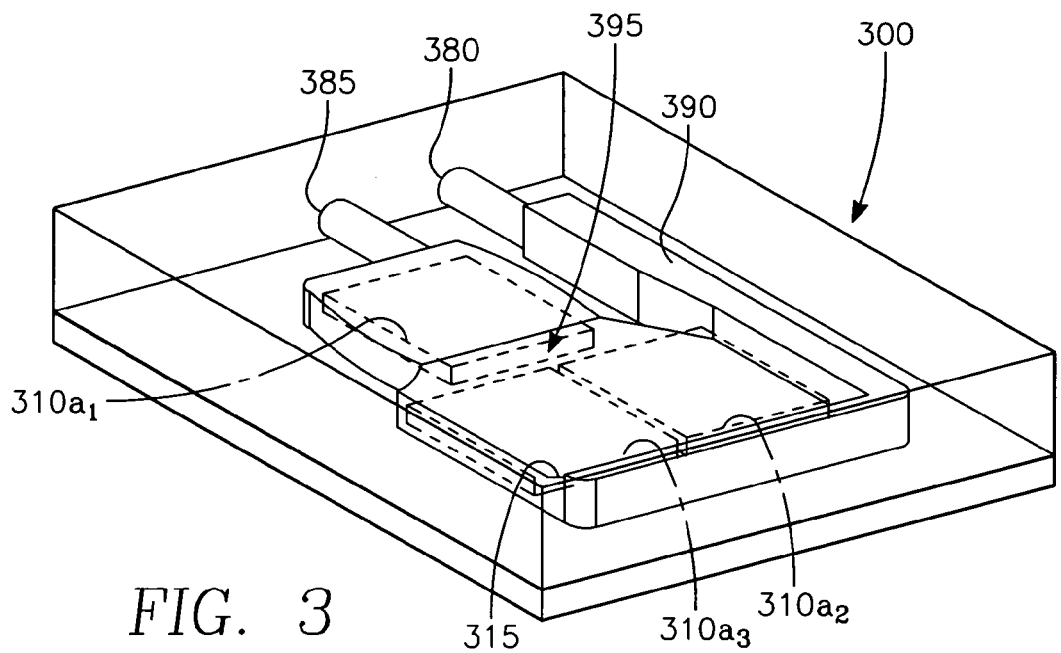
FIG. 3 shows a simplified perspective view illustration of a multichip module showing the combination parallel-series flow of FIG. 2.

FIG. 3 shows a simplified perspective view illustration of an MCM 300 showing the combination parallel-series flow of FIG. 2. The baffle 390 has an inlet 380 and outlet 385. The ramp-down region 315 reduces the cross-sectional area and funnels the coolant to direct it to flow through heat sinks $310a_2$ and $310a_3$. This increases the pressure prior to the heat sinks $310a_2$ and $310a_3$ to compensate for the pressure drop that occurs across the heat sinks $310a_2$, $310a_3$, and $310a$.

Figure 4:
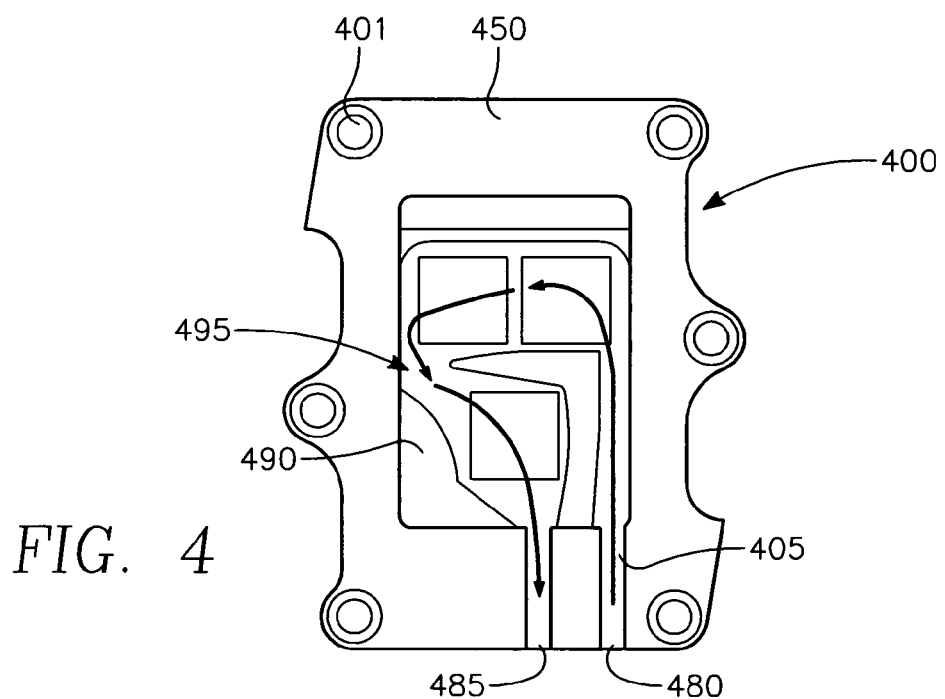
FIG. 4 shows a simplified cut away top view of an alternate embodiment of a multichip module illustrating coolant flow through a baffled chamber.

FIG. 4 shows a simplified cut away top view of an alternate embodiment of an MCM 400 illustrating coolant 405 flow (arrows) through the baffled chamber 495. As shown in FIG. 4, in an alternate embodiment, it is possible to have a series flow baffle 490 to provide series flow 405 over CHIP 3, CHIP 2, and CHIP 1. As with the MCM embodiment of FIG. 2, in FIG. 4, the inlet 480 and outlet 485 are located on an edge of the MCM.

The lid 450 may be secured to the bolster plate (not shown) on the opposite side of the printed circuit board (not show) with a threaded fastener 401.

With an interchangeable baffle, either by changing the lid, or by changing a baffle insert in the lid, the fluid flow may be customized to provide the proper thermal dissipation for a particular chip set in the MCM. Thus, coolant flow may be directed at the hottest chips first, if desired. Also, the flow can be directed at the heat sink fins for any chip layout, or even at a specific location or locations on a chip.

Figure 5:
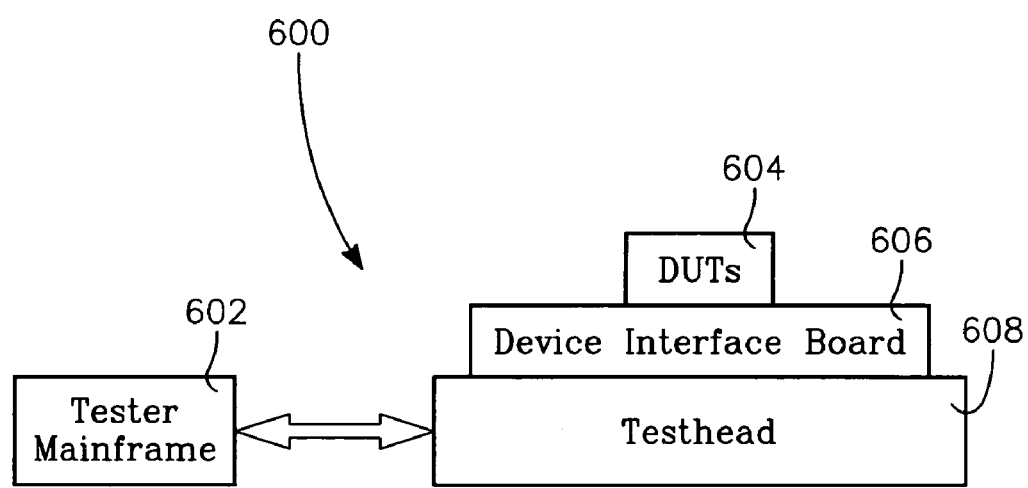
FIG. 5 shows a block diagram of a possible embodiment of an automated tester.

FIG. 5 shows a block diagram of a possible embodiment of an automated tester 600. In the embodiment shown, the tester 600 includes a tester mainframe 602 and a testhead 608 for testing a DUT 604 via a device interface board. In some embodiments of the automated tester 600, one or more MCMs, illustrated with reference to FIGS. 1–4, may be located in the test head 608 on a channel card and include pin electronics circuitry, pattern generation circuitry, and other circuitry. MCMs may also be located in the mainframe 602 or other mainframe computer, or other computing device requiring MCM cooling.

Having described this invention in connection with a number of embodiments, modification will now certainly suggest itself to those skilled in the art. As such, the invention is not to be limited to the disclosed embodiments, except as required by the appended claims.

What we claim is:

1. A liquid immersion cooled multichip module comprising:
   a) a printed circuit board;
   b) a substrate having a plurality of chips mounted thereon and being adapted to mount with the printed circuit board;
   c) a lid adapted to be secured to the printed circuit board so as to mount with the substrate to form a fluid chamber between the lid and the substrate, and to cause the substrate to mate with the printed circuit board;
   d) a bolster plate on a side of the printed circuit board opposite the lid, the lid being fastened to the bolster plate to secure the lid to the printed circuit board; and
   e) a baffle within the lid constructed to direct a flow of coolant through the fluid chamber, the baffle being constructed to direct a flow of coolant through the lid along a generally U-shaped flow path having an inbound segment leading to a transition segment followed by an outbound segment, the outbound segment supplying coolant fluid over the plurality of chips so as to provide a parallel flow over a first set of chips followed by a series flow over a downstream chip, the inbound segment supplying a partial flow of coolant laterally across an adjacent chip of the first set of chips so as to combine with the parallel flow.

2. The multichip module of claim 1, wherein the bolster plate is a cambered bolster plate.

3. The multichip module of claim 1, wherein the baffle further comprises a ramp down region positioned adjacent the first set of chips.

4. The multichip module of claim 1, wherein the baffle further comprises a flow separator adjacent to the first set of chips.

5. The multichip module of claim 1 further comprising an O-ring between the lid and the substrate, and wherein the lid is secured to the bolster plate using a threaded fastener to compress the O-ring between the lid and the substrate to seal the fluid chamber.

6. The multichip module of claim 1, wherein the lid further comprises a fluid inlet and a fluid outlet, the fluid inlet and fluid outlet being located on a same peripheral edge the lid.

7. A liquid immersion cooled multichip module comprising:
   a) a printed circuit board;

b) a substrate having a plurality of chips mounted thereon and being adapted to mount with the printed circuit board;

c) a lid adapted to be secured to the printed circuit board so as to mount with the substrate to form a fluid chamber between the lid and the substrate, and to cause the substrate to mate with the printed circuit board;

d) a cambered bolster plate on a side of the printed circuit board opposite the lid, the lid being fastened to the cambered bolster plate to secure the lid to the printed circuit board; and e) the lid comprising a baffle therein constructed to direct a flow of coolant through the fluid chamber, the baffle being constructed to direct a flow of coolant through the lid over the plurality of chips so as to provide a parallel flow over a first set of chips followed by a series flow over a downstream chip.

8. The multichip module of claim 7, wherein the baffle further comprises a ramp down region positioned adjacent the first set of chips.

9. The multichip module of claim 7, wherein the baffle further comprises a flow separator adjacent to the first set of chips.

10. The multichip module of claim 7 further comprising an o-ring between the lid and the substrate, and wherein the lid is secured to the cambered bolster plate using a threaded fastener to compress the O-ring between the lid and the substrate to seal the fluid chamber.

11. The multichip module of claim 7, wherein the lid further comprises a fluid inlet and a fluid outlet, the fluid inlet and the fluid outlet being located on a same peripheral edge the lid.

12. The multichip module of claim 7, wherein the baffle is removable from the lid.

13. A liquid immersion cooled multichip module comprising:

a) a printed circuit board;

b) a substrate having a plurality of chips mounted thereon and being adapted to mount with the printed circuit board;

c) a lid adapted to be secured to the printed circuit board so as to mount with the substrate to form a fluid chamber between the lid and the substrate, and to cause the substrate to mate with the printed circuit board;

d) a bolster plate on a side of the printed circuit board opposite the lid, the lid being fastened to the cambered bolster plate to secure the lid to the printed circuit board;

e) a coolant fluid inlet and outlet located on a same peripheral edge the lid; and f) a removable baffle within the lid constructed to direct a flow of coolant through the fluid chamber.

14. The multichip module of claim 13, wherein the bolster plate is a cambered bolster plate.

15. The multichip module of claim 13, wherein the baffle further comprises a ramp down region positioned adjacent the plurality of chips.

16. The multichip module of claim 13 further comprising an O-ring between the lid and the substrate, the lid being secured to the bolster plate using a threaded fastener to compress the O-ring between the lid and the substrate to seal the fluid chamber.

17. The multichip module of claim 13, wherein the lid further comprises a fluid inlet and a fluid outlet, the fluid inlet and fluid outlet being located on a same peripheral edge the lid.

18. The multichip module of claim 13, wherein the baffle is constructed to direct a flow of coolant through the lid over the plurality of chips so as to provide a parallel flow over a first set of chips followed by a series flow over a downstream chip.

19. The multichip module of claim 13, wherein the baffle is constructed to direct a flow of coolant through the lid along a generally U-shaped flow path having an inbound segment leading to a transition segment followed by an outbound segment, the outbound segment supplying coolant fluid over the plurality of chips so as to provide a parallel flow over a first set of chips followed by a series flow over a downstream chip, the inbound segment supplying a partial flow of coolant laterally across an adjacent chip of the first set of chips to combine with the parallel flow.

20. The multichip module of claim 13, wherein the baffle is constructed to direct a flow of coolant through the lid over the plurality of chips so as to provide a series flow over the plurality of chips.

* * * * *